(12) United States Patent
Werninger

(10) Patent No.: US 6,755,240 B2
(45) Date of Patent: Jun. 29, 2004

(54) COOLING DEVICE FOR AN ELECTRONIC COMPONENT AND COOLING SYSTEM WITH SUCH COOLING DEVICES

(75) Inventor: Johannes Werninger, Zürich (CH)

(73) Assignee: ABB Schweiz AG, Baden (CH)

( * ) Notice: Subject to any disclaimer, the term of this patent is extended or adjusted under 35 U.S.C. 154(b) by 116 days.

(21) Appl. No.: 10/115,963

(22) Filed: Apr. 5, 2002

(65) Prior Publication Data

US 2002/0148596 A1 Oct. 17, 2002

(30) Foreign Application Priority Data

Apr. 12, 2001 (EP) .......................................... 01810365

(51) Int. Cl.[7] ................................................ H01B 7/42
(52) U.S. Cl. ........................ 165/46; 165/185; 165/80.4; 174/15.1; 174/15.6; 174/75 R
(58) Field of Search .......................... 165/46, 185, 80.4; 174/15.1, 15.5, 15.6, 15.7, 75 R, 74 R

(56) References Cited

U.S. PATENT DOCUMENTS

| | | | | |
|---|---|---|---|---|
| 2,483,301 A | * | 9/1949 | Roberds | 174/15.6 |
| 3,601,520 A | * | 8/1971 | Carasso | 174/15.7 |
| 3,644,663 A | * | 2/1972 | Carlson | 174/88 B |
| 3,941,966 A | * | 3/1976 | Schatz | 219/634 |
| 4,319,070 A | * | 3/1982 | Imai et al. | 174/15.7 |
| 4,455,659 A | * | 6/1984 | Kasper et al. | 373/39 |
| 5,229,543 A | * | 7/1993 | Strefling | 174/15.6 |
| 5,486,652 A | * | 1/1996 | Kasper | 174/75 R |

FOREIGN PATENT DOCUMENTS

| | | |
|---|---|---|
| DE | 3738897 | 5/1989 |
| EP | 0611235 | 8/1994 |
| FR | 1355802 | 6/1964 |
| GB | 2333353 | 7/1999 |
| WO | 0021131 | 4/2000 |

* cited by examiner

Primary Examiner—Allen Flanigan
(74) Attorney, Agent, or Firm—Burns, Doane, Swecker & Mathis, L.L.P.

(57) ABSTRACT

A cooling device for an electronic component is specified, which is built up from a stack (1) of profiled plates (2a; 2b) lying on one another and connected to one another and, at the end of the stack, termination plates (3) are provided in the stacking direction (x), at least one of the termination plates (3) being designed to make extensive contact with the electric component. Furthermore, at least one of the profiled plates (2a) has a flexible extension (4), the extension (4) projecting beyond the cross section of the stack (1). In addition, a cooling system with at least two such cooling devices is disclosed.

19 Claims, 4 Drawing Sheets

COOLING DEVICE FOR AN ELECTRONIC COMPONENT AND COOLING SYSTEM WITH SUCH COOLING DEVICES

FIELD OF THE INVENTION

The present invention relates to the field of cooling engineering and busbar engineering. It relates to a cooling device for an electronic component and a cooling system with such cooling devices according to the preamble of the independent claims.

BACKGROUND OF THE INVENTION

Cooling devices for electronic components, in particular for power semiconductor modules, are currently used in a plethora of electronic power circuits. It is usual for a cooling fluid, which flows through the cooling device, to dissipate excess thermal energy from the electronic component to be cooled.

In WO 00/21131, a cooling device suitable for the cooling of an electronic component is disclosed. In this document, the cooling device is built up from profiled plates stacked and lying on one another, the profiled plates being connected to one another. The profile of the profiled plates is configured in such a way that cooling channels are formed in the stack as a result of the profiled plates being stacked. In order to supply a cooling fluid, cooling fluid connections are arranged at right angles to the stacking direction and extend into some of the cooling channels.

Furthermore, the stack of profiled plates of the cooling device from WO 00/21131 is closed off in the stacking direction by termination plates. One of the termination plates is designed as a mounting plate. This mounting plate is used to make extensive contact with the electronic component to be cooled in order to carry heat away to the cooling device. Furthermore, the making of extensive contacts permits an electrical connection, in particular to carry current to or from the electronic component to be cooled. The electrical connection from the mounting plate to a power busbar system is provided via a screw connection.

The problem with the cooling device according to WO 00/21131 is that the electrical connection by means of the screw connection between mounting plate and the power busbar system represents a highly inductive design, as a result of which, in the case of large current changes, high voltages are induced, which can destroy the electronic component to be cooled. Furthermore, mechanical effects which occur on the power busbar system are passed on virtually undamped to the mounting plate connected via the screw connection, so that the electronic component can be damaged or tears off the mounting plate. Furthermore, the screw connection has a high contact resistance, which gives rise to high electrical losses. In addition, such a screw connection requires a great deal of mounting and needs an appropriate amount of space for the mounting and for the accessibility for inspection purposes, so that high costs also arise.

Furthermore, a cooling system, which has two cooling devices, is specified in WO 00/21131. A first cooling device is connected on one side, by its mounting plate and by means of a screw connection, to a power busbar system, so that an electrical connection is produced. On the other side, the first cooling device is likewise connected, by means of a screw connection, to the electric component to be cooled. A second cooling device is connected, both thermally and electrically conductively, to the first cooling device via the component to be cooled and an intermediate busbar system. For this purpose, the second cooling device is pressed against the intermediate busbar system by means of the application of force. The application of force also has the effect that the intermediate busbar system is pressed against the electric component to be cooled.

The above-described cooling system from WO00/21131 is particularly susceptible to mechanical vibrations, which can have the effect of slipping and/or fracture of the second cooling device and/or the intermediate busbar system. As a result, however, the making of thermal contact, to be ensured for adequate heat dissipation, between the second cooling device and the electronic component to be cooled can no longer be achieved via the intermediate busbar system. In addition, the making of electric contact between the two cooling devices via the electronic component to be cooled and the intermediate busbar system is no longer ensured, as a result of the aforementioned slipping. This can lead to partial discharges, as a result of which the electronic component can be destroyed.

SUMMARY OF THE INVENTION

It is therefore an object of the invention to design a cooling device for an electronic component which is distinguished by a low inductance and, at the same time, is flexible in relation to mechanical effects and has a construction which is easy to mount and space-saving and therefore cost-effective. Furthermore, a cooling system is to be specified which comprises the cooling devices according to the invention and has a rugged and vibration-resistant construction with respect to mechanical effects. These objects are achieved by the features of claim 1 and 12. Advantageous developments of the invention are specified in the sub-claims.

The cooling device according to the invention for an electronic component is built up from a stack of profiled plates lying on one another and connected to one another. At the end of the stack, termination plates are provided in the stacking direction, at least one of the termination plates being designed to make extensive contact, both thermal and electrical, with the electric component. According to the invention, at least one of the profiled plates has a flexible extension which projects beyond the cross section of the stack. By means of this flexible extension, a particularly low-inductance possible connection is provided, for example to a power busbar system, so that the risk of the destruction of the electronic component to be cooled, as a result of high induced voltages, can be minimized. With the aid of the flexible extension, mechanical effects, in particular shaking movements or mechanical vibrations, are advantageously kept away from the making of contact between the component to be cooled on the termination plate, and therefore from the component itself, so that even severe mechanical effects on the flexible extension have virtually no mechanical effect on the stack of profiled plates, on the termination plates and on the component. The cooling device according to the invention is additionally built up very simply, in a space-saving and easy-to-mount manner, in particular in the event of replacement of the electronic component, since there are no screw connections requiring a great deal of mounting and maintenance, as disclosed by the prior art, so that in addition a cost-effective construction is achieved.

In the cooling system according to the invention, at least one flexible extension of a first cooling device is connected to at least a second cooling device. By means of this connection, a particularly rugged construction of the cooling system according to the invention is achieved, which is primarily distinguished with respect to mechanical effects. As a result, such effects are kept away to the greatest possible extent from the respective electronic component associated with each cooling device, so that even under extreme mechanical effects, the making of thermal and electrical contact with the respective electronic component on the associated termination plate can be ensured.

This and further objects, advantages and features of the present invention will become obvious from the following detailed description of preferred exemplary embodiments of the invention, in conjunction with the drawing.

Figure 1:
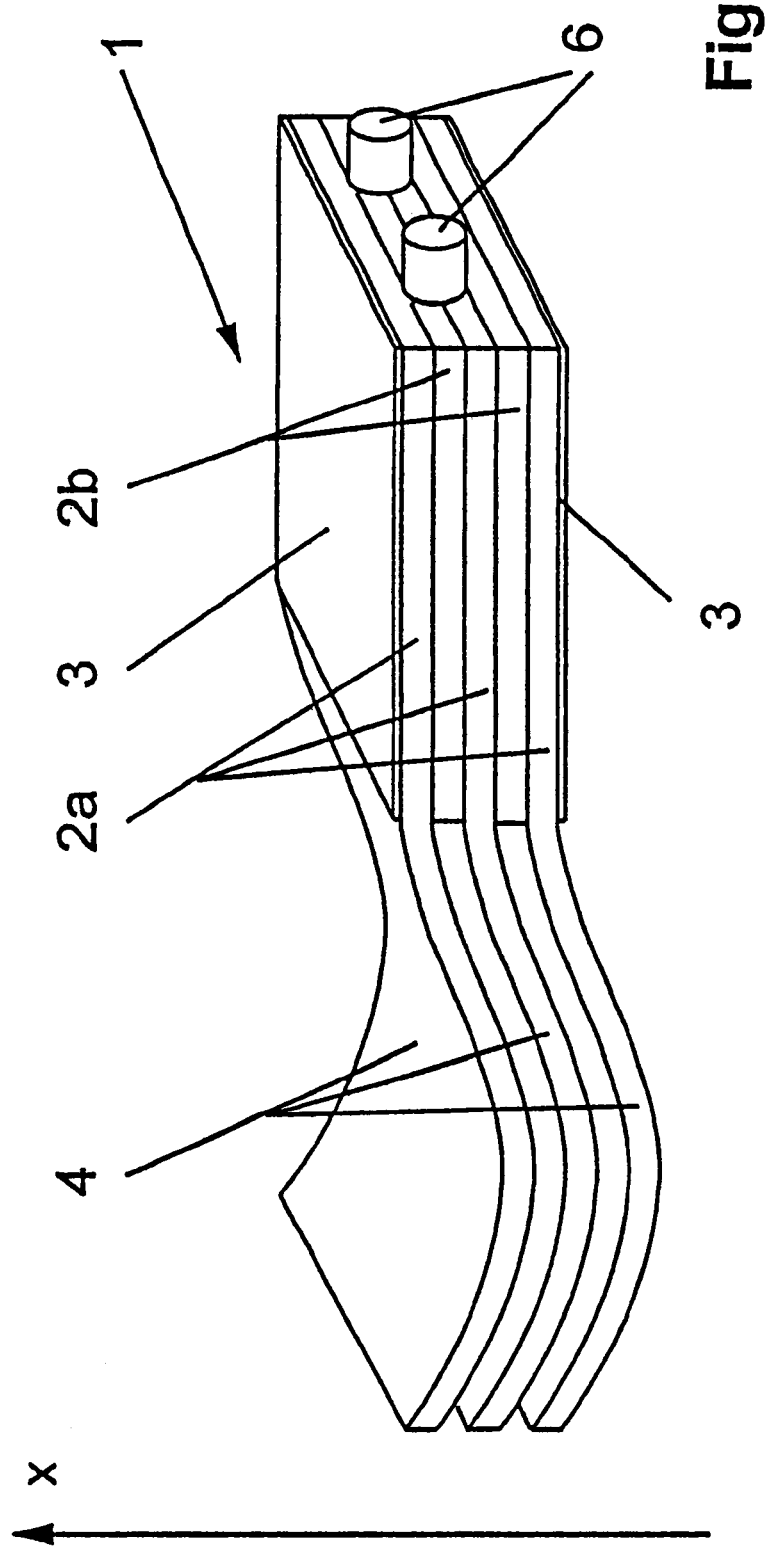
FIG. 1 shows a three-dimensional representation of a first embodiment of a cooling device according to the invention for an electronic component.

The reference symbols used in the drawing and their significance are listed in summary in the list of reference symbols. In principle, identical parts are provided with identical reference symbols in the figures. The embodiments described are exemplary of the subject of the invention and have no restrictive effect.

DETAILED DESCRIPTION OF THE INVENTION

FIG. 1 shows a three-dimensional representation of a first embodiment of a cooling device according to the invention for an electronic component. The cooling device is built up from a stack 1 of profiled plates 2a, 2b lying on one another, the profiled plates 2a, 2b being connected to one another, preferably in the edge region of the cross section of the stack 1. This connection between the profiled plates 2a, 2b is preferably a welded connection or a connection which, by means of the influence of heat and simultaneous action of pressure in the stacking direction x, has the effect of bonding the profiled plates 2a, 2b to one another. According to FIG. 1, termination plates 3 are provided at the end of the stack in the stacking direction x. According to FIG. 1, in each case a termination plate 3 at the end of the stack is connected in the stacking direction to in each case one profile plate 2a, 2b in the same way as the interconnection of the profiled plates 2a, 2b described above. At least one of the termination plates 3 is designed in such a way that contact can be made extensively, both electrically and thermally, with an electronic component to be cooled. For reasons of clarity, however, such an electronic component is not illustrated in FIG. 1. The profiled plates 2a, 2b and the termination plates 3 are built up from an electrically conductive material, which achieves the desired making of electrical and thermal contact with the electronic component to be cooled, and the cooling device itself is electrically conductive. Aluminum is advantageously selected as the conductive material, so that weight and costs can be saved.

According to the invention, at least one of the profiled plates 2a has a flexible extension 4, which projects beyond the cross section of the stack 1. By means of this flexible extension 4, a particularly low-inductance possible connection, for example to a power busbar system, is achieved, so that high induced voltages can be reduced or avoided, and therefore the risk of destruction of the electronic component to be cooled can be minimized. Furthermore, according to FIG. 1, the cooling device according to the invention is constructed so as to be very easy to mount, space-saving and therefore cost-effective, since no screw connections known from the prior art, for example to a power busbar system, are used. Furthermore, by means of the flexible extension 4, mechanical effects, in particular shaking movements or mechanical vibrations, are advantageously kept away from the making of contact with the component on the termination plate 3, and therefore from the component itself, since the flexible extension 4 absorbs these effects, but transmits them only to a low extent to the stack 1 of the profiled plates 2a, 2b, to the termination plates 3 and to the component.

According to FIG. 1, the flexible extension 4 advantageously runs substantially obliquely with respect to the stacking direction x of the profiled plates 2a, 2b. As a result, a further improvement in terms of keeping mechanical effects away from the stack 1, the termination plates 3 and the component can be achieved since, as a result of the oblique course of the flexible extension 4 with respect to the stacking direction x, a sufficiently high deflection amplitude of the flexible extension 4 is available to accommodate high amplitudes of mechanical effects on the flexible extension. Furthermore, a construction which is easy to mount is achieved, as a result of which the electronic component to be cooled can, for example, be replaced very easily and quickly.

Figure 2:
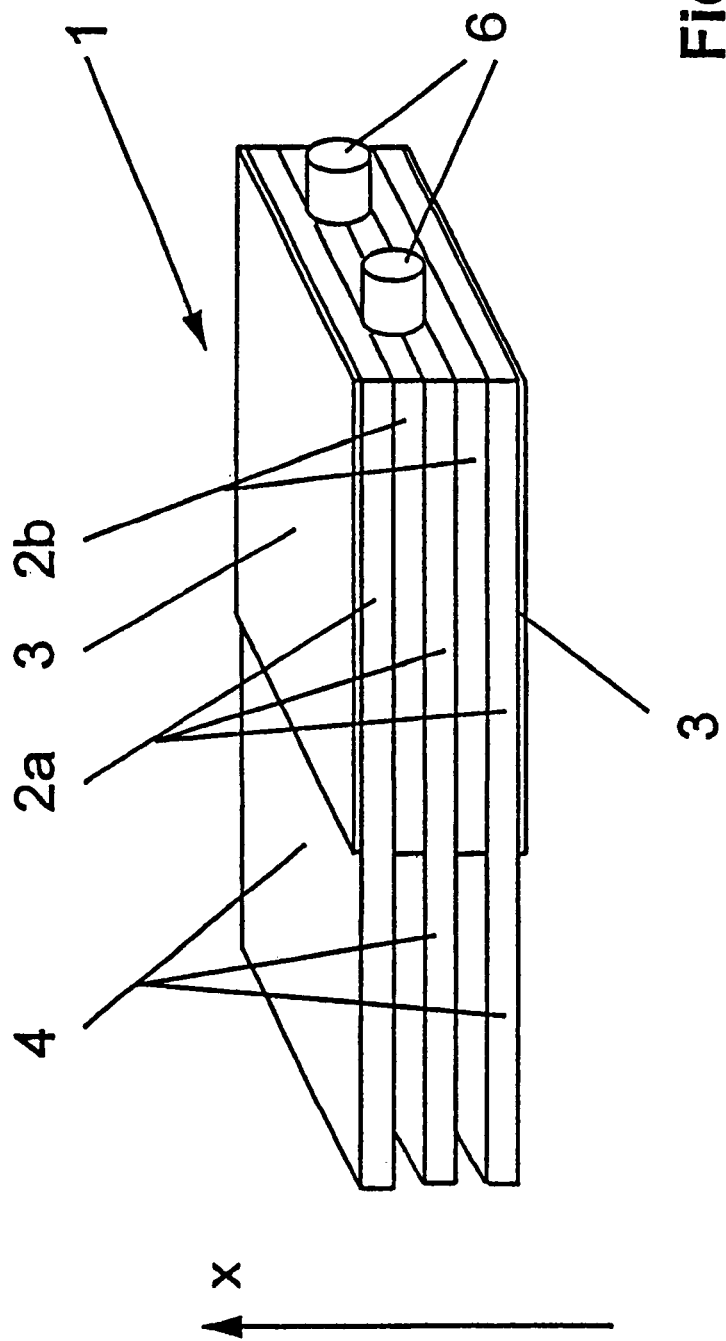
FIG. 2 shows a three-dimensional representation of a second embodiment of a cooling device according to the invention for an electronic component.

A three-dimensional representation of a second embodiment of the cooling device according to the invention for an electronic component is shown in FIG. 2. The embodiment of the cooling device represented in FIG. 2 differs from the embodiment of the cooling device shown in FIG. 1 in the fact that the flexible extension 4 runs substantially perpendicular to the stacking direction x. As a result of this course of the flexible extension 4, a very short connection, for example to a power busbar system, is achieved, needing little material.

In FIG. 1 and FIG. 2, a plurality of profiled plates 2a each having a flexible extension 4 is provided, the flexible extensions 4 preferably running substantially parallel. As a result, further material can advantageously be saved. In addition, the production process of the profiled plates 2a each having a flexible extension 4 is simplified, since only substantially identically shaped profiled plates 2a each having a flexible extension 4 have to be produced. In addition, according to FIG. 1 and FIG. 2, according to the invention, adjacent to each profiled plate 2a with a flexible extension 4 there is at least one profiled plate 2b without an extension 4. By means of this arrangement of the profiled plates 2a, 2b, the surface of the cooling device is enlarged and, for example, air can circulate between the flexible extensions 4, which means that an improvement in the cooling performance of the cooling device can be achieved. A further improvement in the cooling performance and a saving in material is achieved by no screw connections, as known from the prior art, being used, for example to a power busbar system, instead by the profiled plates 2a with the associated flexible extensions 4 in each case being designed in one piece and therefore representing a continuous thermal transfer.

Figure 3:
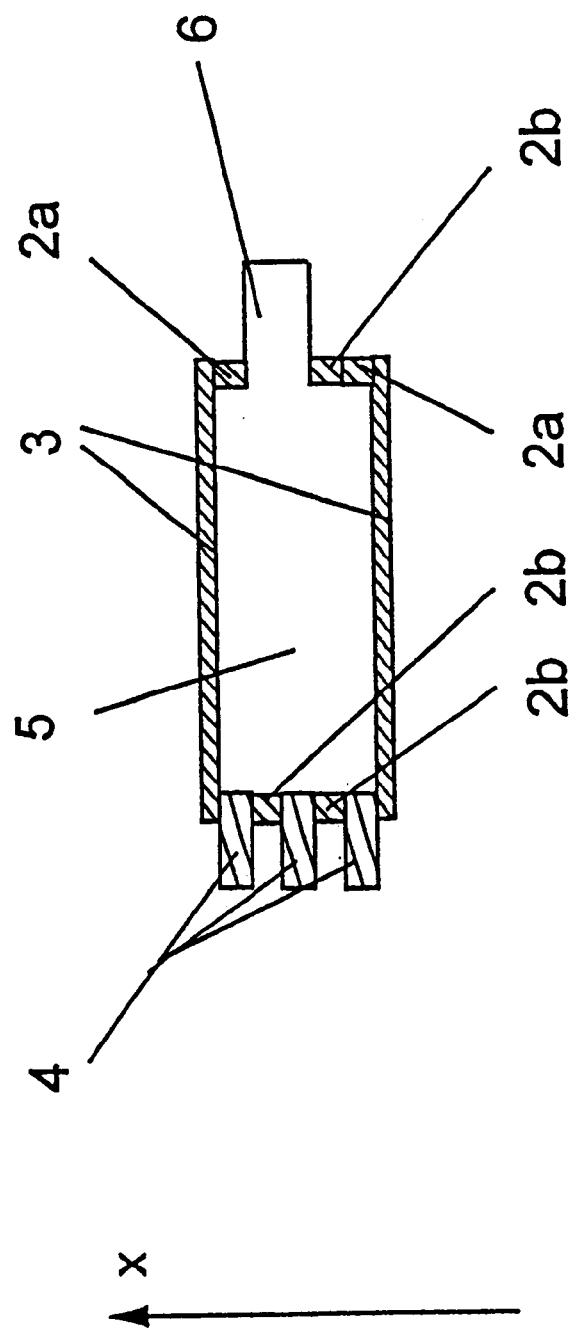
FIG. 3 shows a sectional representation of the second embodiment of the cooling device according to the invention for an electronic component and FIG. 4 shows a three-dimensional representation of a cooling system according to the invention.

A sectional illustration in the stacking direction x of the second embodiment of the cooling device according to the invention according to FIG. 2 is shown in FIG. 3. The profiled plates 2a, 2b are advantageously designed as metal sheets, according to FIG. 3, so that the desired flexibility of the flexible extension 4 can be achieved in a particularly straightforward manner. Furthermore, the surface of the cooling device can be enlarged further by means of a stack built up from such profiled plates 2a, 2b designed as metal sheets, and therefore the cooling performance of the cooling device may be improved considerably. The profiled plates 2a, 2b, as already mentioned above, are preferably connected to one another in the edge region of the cross section of the stack. Each profiled plate 2a, 2b has a substantially frame-like profile, as shown in particular in FIG. 3. The stack 1 of such profiled plates 2a, 2b forms at least one cavity 5, in which a cooling fluid can circulate. In order to supply and discharge the cooling fluid, cooling fluid connection openings 6 are provided perpendicular to the stacking direction x, being formed as leadthroughs into the cavity 5 from outside the stack. As a result, the cooling fluid can be supplied and discharged particularly simply.

Figure 4:
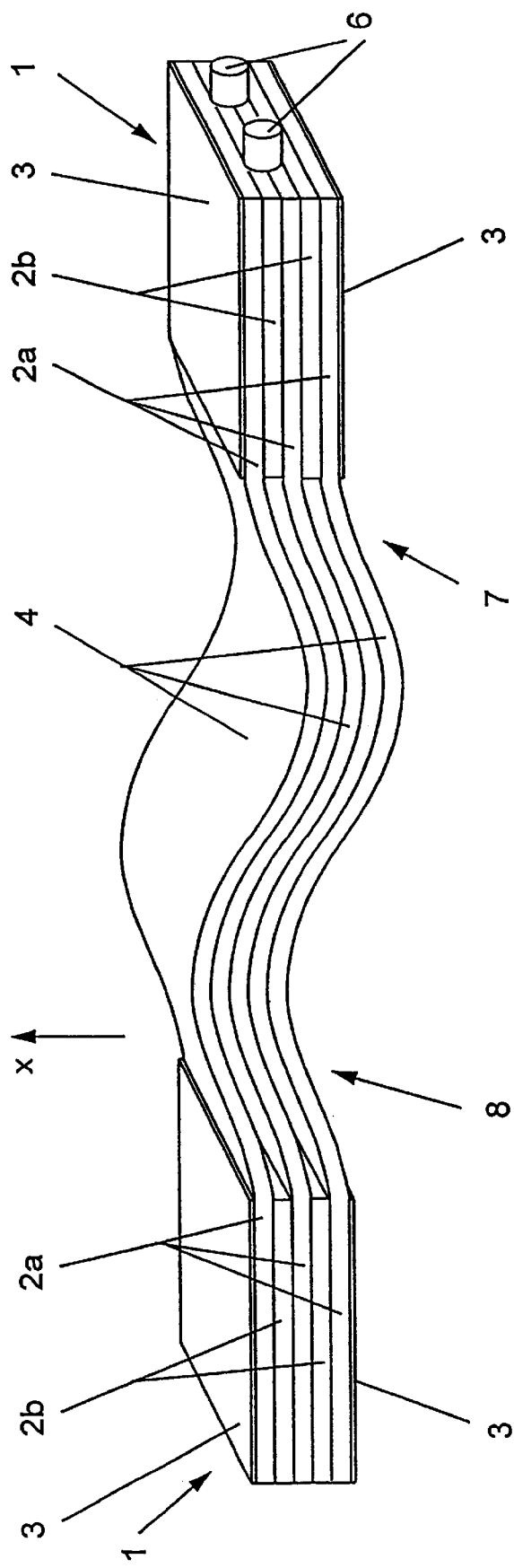

FIG. 4 shows a three-dimensional representation of a cooling system according to the invention, which is built up from cooling devices according to the invention. The cooling system according to the invention has at least two cooling devices 7, 8, at least one flexible extension 4 of a first cooling device 7 being connected to at least a second cooling device 8. As a result, a plurality of electronic components can be cooled, in addition an electrical connection between the individual electronic components and/or between the electronic components and, for example, a power busbar system being made possible. According to FIG. 4, the first cooling device 7 with its flexible extensions 4 is preferably connected to the flexible extensions 4 of the second cooling device 8, so that an electrically and thermally conductive connection between the two cooling devices 7, 8 is advantageously produced. The advantages of the cooling system according to the invention moreover reside in its low-inductance construction and in keeping mechanical effects away from the making of contacts with the electronic components on the respective termination plates 3, and therefore from the electronic components themselves, by means of the interconnected flexible extensions 4 of the individual cooling devices 7, 8. Furthermore, the cooling performance for the individual electronic components can advantageously be improved by means of a large surface of the cooling system.

Overall, the cooling device according to the invention and the cooling system according to the invention constitute a particularly simple and therefore cost-effective and reliable solution which is primarily distinguished by their low-inductance construction and by their positive characteristics in relation to mechanical effects as described above.

List of Reference Symbols
1 Stack
2a; 2b Profiled plate
3 Termination plate
4 Extension
5 Cavity
6 Cooling fluid connection openings
7 First cooling device
8 Second cooling device

What is claimed is:

1. A cooling device for an electronic component, which is built from a stack of profiled plates lying on one another and connected to one another and, at the end of the stack, termination plates are provided in the stacking direction (x), at least one of the termination plates being designed to make extensive contact with the electric component, and at least one of the profiled plates has a flexible extension, and the extension projects beyond the cross section of the stack, wherein adjacent to each profiled plate with extension there is at least one profiled plate without an extension.

2. The cooling device as claimed in claim 1, wherein the profiled plates are designed as metal sheets.

3. The cooling device as claimed in claim 1, wherein the extension runs substantially perpendicular to the stacking direction (x).

4. The cooling device as claimed in claim 1, wherein the extension runs substantially obliquely with respect to the stacking direction (x).

5. The cooling device as claimed in claim 1, wherein the profiled plates are built up from an electrically conductive material.

6. The cooling device as claimed in claim 5, wherein the electrically conductive material is aluminum.

7. The cooling device as claimed in claim 1, wherein in the case of a plurality of profiled plates each having an extension, the extensions run substantially parallel.

8. The cooling device as claimed in claim 1, wherein each profiled plate has a substantially frame-like profile.

9. The cooling device as claimed in claim 8, wherein the stacked profiled plates form at least one cavity in the interior of the stack.

10. The cooling device as claimed in claim 9, wherein perpendicular to the stacking direction (x), cooling fluid connection openings are provided, which are formed as leadthroughs into the cavity from outside the stack.

11. A cooling device for an electronic component, which is built from a stack of profiled plates lying one on another and connected to one another and, at the end of the stack, termination plates are provided in the stacking direction (x), at least one of the termination plates being designed to make extensive contact with the electronic component, and at least one of the profiled plates has a flexible extension, and the extension projects beyond the cross section of the stack, wherein each profiled plate has a substantially frame-like profile, the stacked profile plates form at least one cavity in the interior of the stack, and perpendicular to the stacking direction (x), cooling fluid connection openings are provided, which are formed as leadthroughs into the cavity from outside the stack.

12. The cooling device as claimed in claim 11, wherein the profiled plates are designed as metal sheets.

13. The cooling device as claimed in claim 11, wherein the extension runs substantially perpendicular to the stacking direction (x).

14. The cooling device as claimed in claim 11, wherein the extension runs substantially obliquely with respect to the stacking direction (x).

15. The cooling device as claimed in claim 11, wherein the profiled plates are built up from an electrically conductive material.

16. The cooling device as claimed in claim 15, wherein the electrically conductive material is aluminum.

17. The cooling device as claimed in claim 11, wherein in the case of a plurality of profiled plates each having an extension, the extensions run substantially parallel.

18. A cooling system having at least two cooling devices as claimed in claim 1, wherein at least one extension of a first cooling device is connected to at least a second cooling device.

19. A cooling system having at least two cooling devices as claimed in claim 11, wherein at least one extension of a first cooling device is connected to at least a second cooling device.

* * * * *